US009104122B2

(12) United States Patent
Lorusso et al.

(10) Patent No.: US 9,104,122 B2
(45) Date of Patent: Aug. 11, 2015

(54) METHODS AND SYSTEMS FOR EVALUATING EXTREME ULTRAVIOLET MASK FLATNESS

(75) Inventors: Gian Francesco Lorusso, Overijse (BE); Sang Lee, Saratoga, CA (US)

(73) Assignee: IMEC, Leuven (BE)

( * ) Notice: Subject to any disclaimer, the term of this patent is extended or adjusted under 35 U.S.C. 154(b) by 901 days.

(21) Appl. No.: 13/239,052

(22) Filed: Sep. 21, 2011

(65) Prior Publication Data

US 2012/0075604 A1 Mar. 29, 2012

Related U.S. Application Data

(60) Provisional application No. 61/386,967, filed on Sep. 27, 2010.

(30) Foreign Application Priority Data

Dec. 8, 2010 (EP) .................................... 10194072

(51) Int. Cl.
*G03B 27/68* (2006.01)
*G03B 27/54* (2006.01)
(Continued)

(52) U.S. Cl.
CPC ............... *G03F 7/7085* (2013.01); *G03F 1/24* (2013.01); *G03F 1/84* (2013.01); *G03F 7/70525* (2013.01); *G03F 7/70616* (2013.01); *G03F 7/70783* (2013.01)

(58) Field of Classification Search
CPC ......... G03F 1/24; G03F 1/84; G03F 7/70283; G03F 7/703; G03F 7/70525; G03F 7/70591; G03F 7/70616; G03F 7/7065; G03F 7/70666; G03F 7/70675; G03F 7/70783; G03F 7/7085

USPC .......... 355/30, 52, 53, 55, 67–77; 250/492.1, 250/492.2, 492.22, 493.1, 548; 430/5, 8, 430/20, 22, 30; 356/237.2–237.6; 378/34, 378/35

See application file for complete search history.

(56) References Cited

U.S. PATENT DOCUMENTS 6,233,056 B1    5/2001   Naulleau et al.
6,262,792 B1 *  7/2001   Higashiki ........................ 355/52
(Continued)

FOREIGN PATENT DOCUMENTS

JP               57-64139            4/1982

OTHER PUBLICATIONS

Nataraju, Madhura et al., "Electrostatic Chucking of EUVL Reticles", Proc. of SPIE, vol. 6517, 2007, pp. 65170Y-1-65170Y-8.
(Continued)

*Primary Examiner* — Christina Riddle
(74) *Attorney, Agent, or Firm* — McDonnell Boehnen Hulbert & Berghoff LLP

(57) ABSTRACT

Disclosed are methods and systems for determining a topography of a lithographic optical element and/or a holder of a lithographic optical element. In one embodiment, the method includes directing electromagnetic radiation towards a lithographic optical element, where the electromagnetic radiation comprises electromagnetic radiation in a first predetermined wavelength range and electromagnetic radiation in a second predetermined wavelength range. The method further includes using the lithographic optical element to adsorb the electromagnetic radiation in the first predetermined wavelength range, and to reflect at least a portion of the electromagnetic radiation in the second predetermined wavelength range towards a substrate comprising a photosensitive layer, thereby exposing the photosensitive layer to form an exposed photosensitive layer. The method still further includes performing an evaluation of the exposed photosensitive layer and, based on the evaluation, determining a topography of the lithographic optical element.

19 Claims, 12 Drawing Sheets

(51) Int. Cl.

| | | |
|---|---|---|
| *G03B 27/62* | (2006.01) | |
| *G03B 27/32* | (2006.01) | |
| *G03F 7/20* | (2006.01) | |
| *G03F 1/24* | (2012.01) | |
| *G03F 1/84* | (2012.01) | |
| *G03B 27/52* | (2006.01) | |
| *G03B 27/42* | (2006.01) | |

(56) References Cited

U.S. PATENT DOCUMENTS

| | | | |
|---|---|---|---|
| 6,312,373 | B1 | 11/2001 | Ichihara |
| 6,466,382 | B2* | 10/2002 | Muller-Rissmann et al. 359/820 |
| 6,950,176 | B1 | 9/2005 | LaFontaine et al. |
| 7,239,368 | B2* | 7/2007 | Oesterholt et al. ............... 355/52 |
| 2002/0041368 | A1* | 4/2002 | Ota et al. ......................... 355/55 |
| 2003/0016338 | A1* | 1/2003 | Yasuda et al. ................... 355/55 |
| 2004/0013956 | A1* | 1/2004 | Sogard ............................. 430/30 |
| 2005/0157311 | A1 | 7/2005 | Kuchel |
| 2006/0194126 | A1* | 8/2006 | Tanabe .............................. 430/5 |
| 2006/0245057 | A1* | 11/2006 | Van Herpen et al. .......... 359/587 |
| 2007/0061771 | A1 | 3/2007 | Habitz et al. |
| 2007/0222964 | A1* | 9/2007 | Katsuhiko et al. ............... 355/71 |
| 2008/0030742 | A1 | 2/2008 | Hill |
| 2008/0079927 | A1* | 4/2008 | Vernon ............................ 355/75 |
| 2009/0027643 | A1* | 1/2009 | Yeh et al. ......................... 355/55 |
| 2009/0135431 | A1 | 5/2009 | Yamauchi et al. |

OTHER PUBLICATIONS

Orvek, Kevin et al., "Evaluation of an e-beam Correction Strategy for Compensation of EUVL Mask Non-flatness", Proc. of SPIE, vol. 7379, 2009, pp. 73790Q-1-73790Q-9.

Wang, S.H. et al., "Application of an Optical Interferometer for Measuring the Surface Contour of Micro-Components", Measurement Science and Technology, vol. 17, 2006, pp. 617-625.

Kalkowsi, Gerhard et al., "Flatness Characterization of EUV Mask Chucks", Microeletronic Engineering, vol. 84, 2007, pp. 737-740.

Shu, Emily Y., "Optimization of Electrostatic Chuck for Mask Blank Flatness Control in Extreme Ultra-Violet Lithography", Proc. of SPIE, vol. 6607, 2007, pp. 66070J-1-66070J-12.

* cited by examiner

METHODS AND SYSTEMS FOR EVALUATING EXTREME ULTRAVIOLET MASK FLATNESS

CROSS-REFERENCE TO RELATED APPLICATIONS

This application is a non-provisional of U.S. Provisional Patent Application Ser. No. 61/386,967 filed Sep. 27, 2010, the contents of which are hereby incorporated by reference.

This application claims priority to European Patent Application No. 10194072.4 filed Dec. 8, 2010, the contents of which are incorporated by reference herein in their entirety.

BACKGROUND

Optical lithography nowadays often uses wavelengths of 248 nm or 193 nm. With 193 nm immersion lithography, integrated circuit (IC) manufacturing is possible down to 45 nm node, or even down to 32 nm node. However for printing in sub-32 nm half pitch node, this wavelength is probably not satisfactory due to theoretical limitations, unless double patterning is used.

Instead of using wavelengths of 193 nm, a more advanced technology has been introduced, which may be referred to as extreme ultraviolet lithography (EUV lithography). EUV lithography typically uses wavelengths of 10 nm to 14 nm, often 13.5 nm. This technique was previously also known as soft X-ray lithography, which typically uses wavelengths in a wider range of 2 nm to 50 nm.

For optical lithography using wavelengths in the deep ultra violet (DUV) range, the electromagnetic radiation is transmitted by most materials, including glass used for conventional lenses and masks. For optical lithography using shorter wavelengths however, including EUV and soft X-ray lithography, the electromagnetic radiation is absorbed by most materials, including glass used for conventional lenses and masks.

For at least this reason, a completely different imaging system is typically used to perform EUV lithography than is used to perform conventional optical lithography. Instead of using lenses, such an imaging system typically relies on all-reflective optics. That is, such an imaging system is typically composed of reflective optical elements, also referred to as catoptric elements, such as mirrors. These reflective optical elements typically are coated with multilayer structures designed to have a high reflectivity (e.g., up to 70%) at the 13.5 nm wavelength. Furthermore, as air will also absorb EUV light, such an imaging system typically includes a vacuum environment.

In addition to the new imaging system, EUV lithography has introduced a number of other challenges as well. One of these challenges relates to the flatness requirement of the chucked mask (or reticle). Mask flatness requirements are stringent, as even small amounts of non-flatness may cause unacceptable overlay errors to occur. According to SEMI EUV mask and mask chucking standards (P37, the specification for EUV lithography masks substrates and P40, the specification for mounting requirements and alignment reference location for EUV lithography masks), the mask flatness requirements are set at a mask flatness error less than 30 nm peak-to-peak valley for the 22 nm technology node and beyond.

One option for meeting these stringent requirements for mask flatness is an electrostatic chuck. The electrostatic chuck has been optimized for mask blank flatness control. Offline interferometric metrology tools have been developed to enable electrostatic chucking experimentation, as disclosed by, for example, Shu (see Proceedings of SPIE Vol. 6607, 2007). Further, Nataraju et al. disclose performing flatness measurements of the chucked mask using a Zygo interferometer, and have introduced in a finite element model to determine the geometry of the reticle and chuck surface (see Proceedings of SPIE Vol. 6517, 2007). However, these models do not incorporate the chuck properties which may alter from tool to tool. Further, both examples are ex situ, meaning they take place outside the lithographic tool measurement techniques.

An interferometer may be used to determine the flatness of an optical element. The technique is based on emitting light from an interferometric light source and measuring the interference pattern of the reflected light from the mask and from a reference object by a detector. However, in this technique both a test or reference object and a detector are necessary in a lithographic environment. Further, this technique has never been applied to qualify the overall flatness of the mask in situ in a lithographic system.

An example system with improved mask flatness in a lithographic tool is disclosed by Vernon (see United States Patent Application Pub. No. 2008/0079927). According to Vernon, a holder may be used to carry a lithographic mask in a flattened condition. The holder comprises a plurality of independently controllable actuators coupled to the substrate and to the lithographic mask to flatten the lithographic mask.

Further, an example system for evaluating mask flatness in EUV lithography is disclosed by LaFontaine et al. (see U.S. Pat. No. 6,950,176). The system comprises a contactless capacitance probe. By scanning the chucked EUV mask with the capacitance probe, a flatness profile may be determined. However, in this method the mask has to be completely scanned in order to get an overview of the flatness of the mask. Further, an ultra-high vacuum (UHV) capacitance gauge needs to be installed in situ without interfering the present EUV exposure tools during EUV exposure.

SUMMARY OF CERTAIN INVENTIVE ASPECTS

Due to the criticality of the mask flatness requirements in EUV lithography, methods and systems for evaluating and characterizing the flatness of the mask in situ may be desirable. Disclosed are such methods and systems. In particular, disclosed are methods and systems for evaluating the topography (e.g., curvature, height, contour, and/or elevation profile) of masks and/or mask holders in situ in EUV lithography.

In one aspect, a method is disclosed. The method comprises using an energy source to direct electromagnetic radiation of a first predetermined wavelength towards a lithographic optical element. The method further comprises using the lithographic optical element to direct the electromagnetic radiation onto a substrate comprising a photosensitive layer, thereby exposing the photosensitive layer. The method still further comprises performing an evaluation of the exposed photosensitive layer and, based on the evaluation, determining the topography of the lithographic optical element.

The above method may be performed using a familiar metrology system along with a set of tools typically available in a semiconductor manufacturing environment. Further, the above method may be used to monitor repeatability.

In some embodiments, the lithographic optical element may be a mask. In some embodiments, the lithographic optical element may be held by a holder, such as a chuck.

In some embodiments, the method may further include using an energy source (the same energy source, or an additional energy source) to direct electromagnetic radiation of a second predetermined wavelength towards the lithographic optical element simultaneously with or after the electromagnetic radiation of the first predetermined wavelength. However, at least a portion of the electromagnetic radiation of the second predetermined wavelength may be absorbed in the optical lithographic element or a filter on the optical lithographic element.

In some embodiments, the first predetermined wavelength may be in the DUV range, while the second predetermined wavelength may be in the EUV range.

In some embodiments, the energy source may be a light source of the optical lithographic element, such as the light source typically used for lithography of a semiconductor substrate.

In some embodiments, performing the evaluation of the exposed photosensitive layer may involve performing an optical evaluation of the substrate comprising the exposed photosensitive layer. The optical evaluation may be, for example, an in situ optical evaluation. Further, in some embodiments, performing the evaluation may involve performing an evaluation of height differences and/or fringes in the exposed photosensitive layer.

In some embodiments, the method may further comprise, after determining the topography of the lithographic optical element, correcting the lithographic optical element according to the topography. By using the topography to correct the lithographic optical element, overlay errors in the exposed photosensitive layer may be minimized.

In some embodiments, the lithographic optical element may be positioned on a holder (e.g., a mask holder). In these embodiments, the method may be repeated to determine a topography of the holder. The topography of the holder may then be used to correct the holder. In some embodiments, the method may be repeated to determine a topography of the holder several times. In this manner, a repeatability of the system may be determined.

This method may be repeated using an additional lithographic optical element in place of the lithographical optical element, and the topography of the additional lithographic optical element may be determined. The topographies of the lithographic optical element and the additional lithographic optical element may then be compared to determine any variations between the lithographic optical element and the additional lithographic optical element.

In another aspect, a system is disclosed. The system includes a mask holder (e.g., a chuck) configured to hold a mask, a first energy source configured to emit electromagnetic radiation of a first predetermined wavelength, and a second energy source configured to emit electromagnetic radiation of a second predetermined wavelength. The second predetermined wavelength may be substantially longer than the first predetermined wavelength. The electromagnetic radiation of the first predetermined wavelength may be used for lithographic processing of the substrate, while the electromagnetic radiation of the second predetermined wavelength may be used for determining a topography of the mask. The system may further include a substrate holder configured to hold a substrate comprising a photosensitive layer. The system may still further include optics configured to guide the electromagnetic radiation of the first predetermined wavelength towards the mask. The optics may be further configured to guide the electromagnetic radiation of the second predetermined wavelength towards the photosensitive layer via the mask, thereby exposing the photosensitive layer.

In some embodiments, the first predetermined wavelength may be in the EUV range, while the second predetermined wavelength may be in the DUV range. In this example, the lithographic optical element may be an EUV lithographic optical element.

In some embodiments, the system may further include a filter configured to selectively prevent at least a portion of the electromagnetic radiation of the first wavelength from being incident on the photosensitive layer. The filter may comprise, for example, an absorbing layer on a component of the system, such as the mask.

In some embodiments, the system may further include at least one processor and data storage comprising instructions executable by the processor to determine a topography of the mask and/or the mask holder.

In still another aspect, a system is disclosed. The system comprises an EUV energy source configured to emit EUV electromagnetic radiation having a wavelength in the EUV range such as, for example, 13.5 nm. The EUV electromagnetic radiation may be used to expose a photosensitive layer of a substrate. The system further comprises a DUV energy source configured to emit DUV radiation having a wavelength in the DUV range such as, for example, around 193 nm or around 248 nm. The DUV electromagnetic radiation may be used to evaluate a topography of a mask and/or a holder for the mask, such as a chuck.

Particular and preferred aspects of the invention are set out in the accompanying independent and dependent claims. Features from the dependent claims may be combined with features of the independent claims and with features of other dependent claims as appropriate and not merely as explicitly set out in the claims. For purposes of summarizing the invention and the advantages achieved over the prior art, certain aspects of the invention have been described herein above. Of course, it is to be understood that not necessarily all such aspects may be included with any particular embodiment of the invention. Thus, for example, those skilled in the art will recognize that the invention may be embodied or carried out in a manner that includes one or more aspects as taught herein without necessarily other aspects as taught or suggested herein.

DETAILED DESCRIPTION

Figure 1:
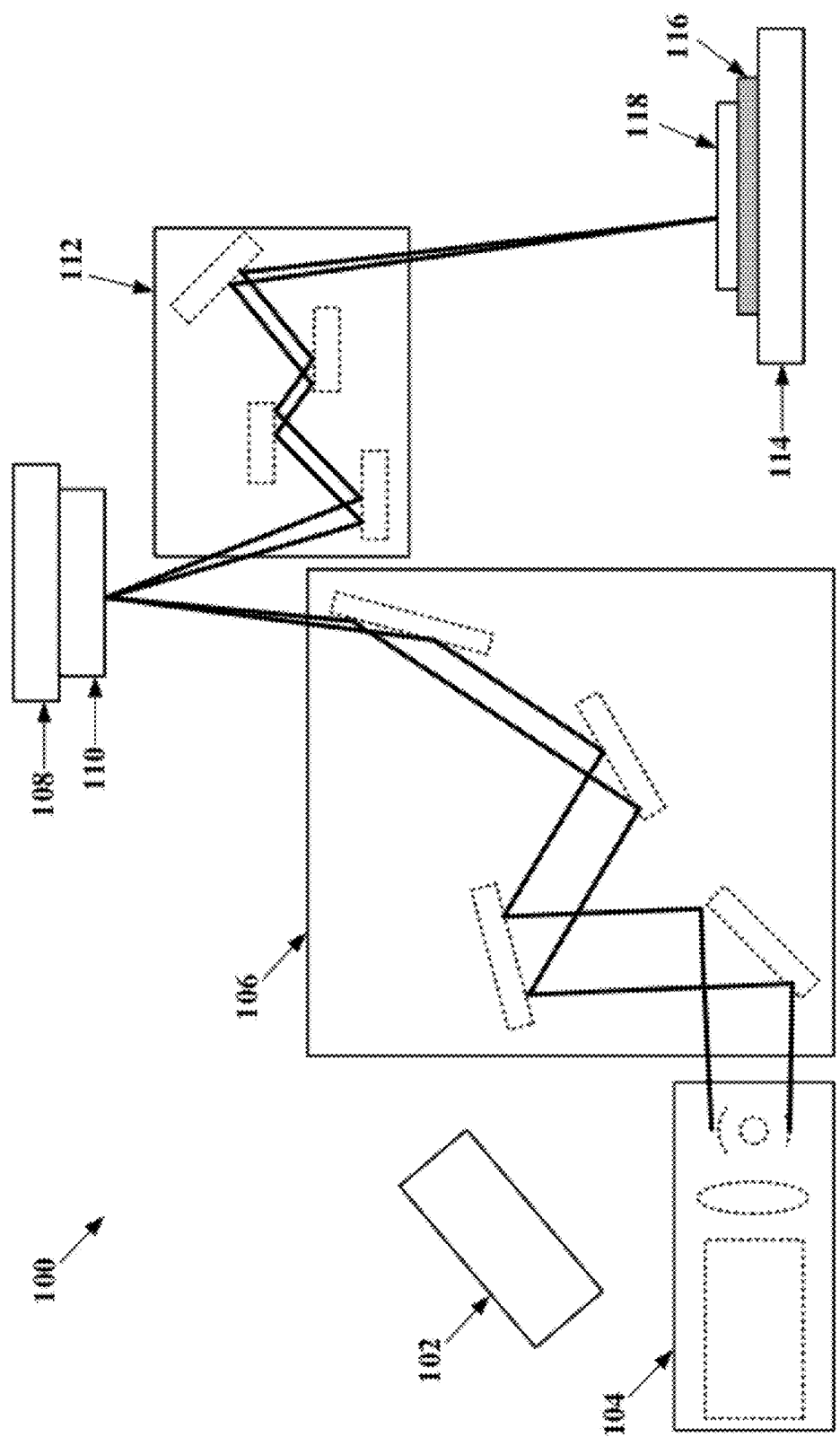
FIG. 1 illustrates a schematic representation of a typical lithographic system, in accordance with an embodiment.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Furthermore, while some embodiments described herein include some but not other features included in other embodiments, combinations of features of different embodiments are meant to be within the scope of the invention, and form different embodiments, as would be understood by those in the art.

Furthermore, some of the embodiments are described herein as a method or combination of elements of a method that can be implemented by a processor of a computer system or by other means of carrying out the function. Thus, a processor combined with instructions executable by the processor for carrying out such a method or element of a method forms a means for carrying out the method or element of a method. The means may comprise, for example, a non-transitory computer readable medium. Furthermore, an element described herein of an apparatus embodiment is an example of a means for carrying out the function performed by the element for the purpose of carrying out the invention.

As used herein, X-ray radiation may be understood to refer to electromagnetic radiation having a wavelength in the range of about 0.01 nm to about 10 nm.

Further, as used herein, EUV radiation may be understood to refer to electromagnetic radiation having a wavelength in the range of about 10 nm to about 20 nm EUV radiation may alternately be referred to as soft X-ray radiation or vacuum ultraviolet radiation. Typical lithographic systems use EUV radiation having a wavelength of about 13.5 nm+/−0.3 nm.

Still further, as used herein, DUV radiation may be understood to refer to electromagnetic radiation having a wavelength in the range of about 121 nm to about 300 nm.

As used herein, monochromatic radiation may refer to electromagnetic radiation comprising a narrow range of wavelengths; the person of ordinary skill in the art will recognize that truly monochromatic radiation comprising a single wavelength is merely theoretical and does not exist experimentally. That is, monochromatic radiation may be understood to mean nearly- or quasi-monochromatic.

A lithographic system may be a system used to perform lithograph processes. Some lithographic systems may be characterized according to a particular wavelength range, such as an EUV lithographic system. A lithographic system typically includes four types of elements: an energy source, a collector, optics, and a mask.

The energy source serves to emit electromagnetic radiation and direct the electromagnetic radiation towards the collector. The collector serves to capture as much electromagnetic radiation from the energy source as possible. The optics serve to guide the electromagnetic radiation towards the mask. To this end, the optics in an EUV lithographic system typically include reflective elements, such as mirrors. The mask contains a pattern to be transferred to a substrate. The electromagnetic radiation allows the pattern to be transferred to the substrate.

A lithographic metrology system may be a system used to characterize and/or optimize various parameters of a lithographic system.

A lithographic optical element may be an optical element used in a lithographic system. The lithographic optical element may be either reflective or non-reflective. The particular lithographic optical element used in a lithographic system may depend on the wavelengths of electromagnetic radiation used in a lithographic process. For example, in an EUV lithographic process, the lithographic optical elements may be reflective, as the lithographic process will be performed in a vacuum.

One example of a lithographic optical element is a mask. Such a lithographic optical element may be used in EUV lithographic processes. In some embodiments, such a mask may be a reflective mirror. Further, in some embodiments such a mask may be a curved, but atomically smooth, surface to which a multilayered coating is applied. The coating may be tuned to give peak reflectivity for a single wavelength of EUV light, such as 13.5 nm. A mask may comprise a glass or ceramic base on which films are deposited.

An EUV mask may include a substrate on which a conductive layer (for electrostatic chucking), a multilayer film stack (for high reflection of EUV radiation), and an absorber film stack (for blocking reflection of light in desired areas). The EUV mask may additionally include a resist layer (for writing a mask pattern). EUV masks may begin as EUV mirrors, and the pattern may be applied as part of the absorber film stack.

One type of mask is a reticle, which is typically used for a stepper or scanner in reduction optics, in which the image on the reticle is magnified. A reticle typically comprises a plate with a pattern of transparent and opaque areas used to create patterns on substrates.

Another example of a lithographic optical element is a lens. Such a lithographic optical element may be used in DUV lithographic processes (as DUV lithographic processes use longer-wavelength radiation than EUV lithographic processes).

Figure 4:
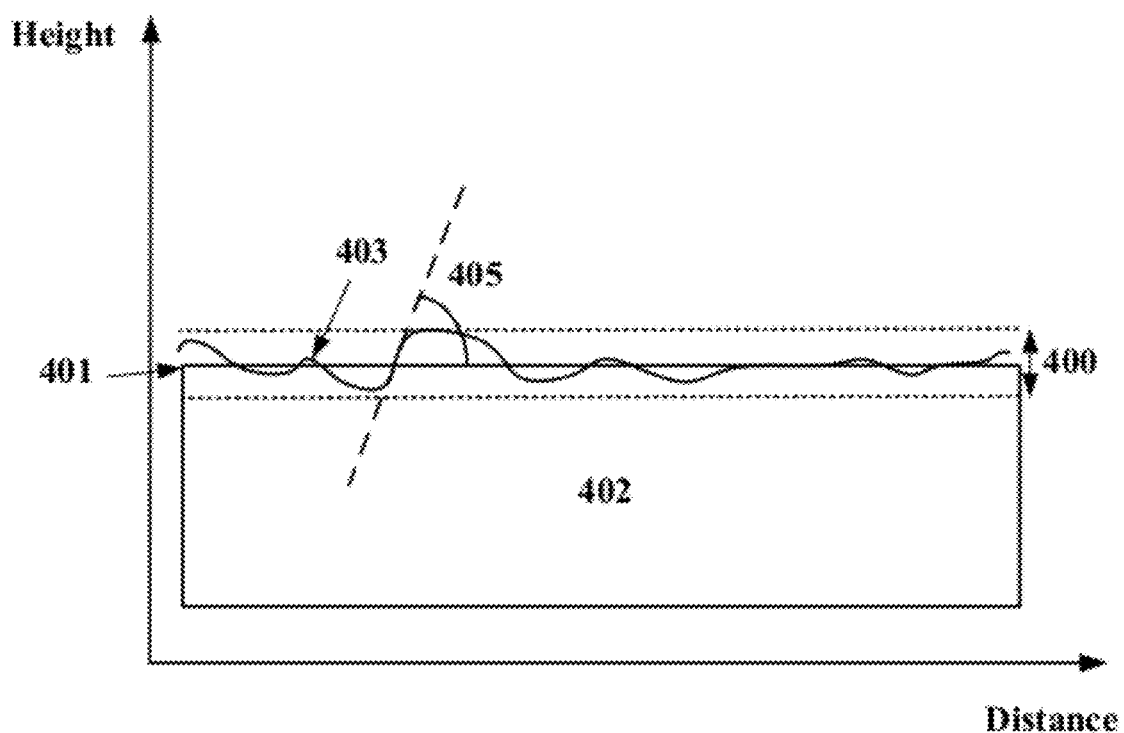
FIG. 4 illustrates a schematic representation of different topography parameters, in accordance with an embodiment.

Flatness error may refer to a deviation of the surface in question from a plane that is defined by a least-squares fit to flatness data. A substrate bow for example, being any curvature of the substrate which may arise from the deposited films on the backside and topside, will contribute to the flatness error. FIG. 4 illustrates a schematic representation of different topography parameters, in accordance with an embodiment. As shown, a substrate 402 has varying flatness. Line 403 illustrates the real, non-flat surface of the substrate 402. Line 401 illustrates the least-squares fit plane for the substrate 402. The peak-to-peak distance 404 of line 403 gives the flatness error. In some cases, a local slope angle 405 may also be defined. The local slope angle 405 indicates the angle between the local slope and the least-squares fit plane (line 401) for the substrate 402.

The disclosed methods and systems may be applicable to lithographic processes using electromagnetic radiation having wavelengths that are on the same order of magnitude or smaller than the feature size of the mask. This often includes EUV lithographic processes.

The disclosed methods and systems according to the embodiments of the present invention will now be explained in more detail with reference to particular embodiments, the present invention not being limited thereto but only being limited by the claims.

Figure 3A:
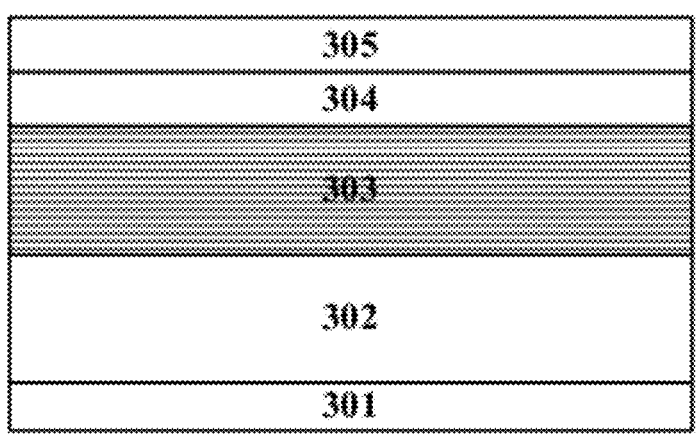
FIGS. 3A and 3B each illustrate a schematic representation of a lithographic optical element, in accordance with an embodiment.
Figure 3B:
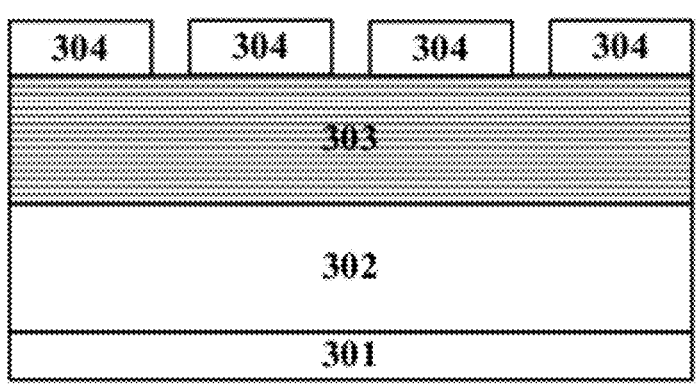

FIGS. 3A and 3B each illustrate a schematic representation of a lithographic optical element, in accordance with an embodiment. The lithographic optical element may be an EUV mask blank, as shown in FIG. 3A, or may be an EUV mask, as shown in FIG. 3B.

As shown in FIG. 3A, the EUV mask blank 300 includes an EUV substrate 302. On a backside of the EUV substrate 302, a conductive layer 301 is deposited. The backside conductive layer 301 comprises a conductive film that serves to enable electrostatic chucking of the substrate 302 during the deposition of the multilayer stack 303, the absorber film stack 304, and/or during EUV scanner exposures.

On a frontside of the EUV substrate 302, a multilayer film stack 303 is formed. The multilayer stack 303 comprises a stack of layers deposited on the substrate 302 to provide high EUV reflectivity. It may also comprise capping layers (not shown) and/or absorber etch stop layers (not shown).

On the multilayer film stack 303, an absorber film stack 304 is formed. The absorber film stack 304 serves to block reflection of electromagnetic radiation. In some embodiments, the absorber film stack 304 may comprise an optional buffer layer (not shown) for use in absorber repair operations. Further, a resist layer 305 for writing a mask patter is deposited.

In a lithographic system, such a mask 300 is typically mounted on a chuck in order to securely hold the mask 300 during the lithographic process. The surface of the chuck that is in direct contact with the mask is defined as the mounting surface. Typically the backside surface of the mask 300, which is not patterned, is in direct contact with the mounting surface. In some embodiments, an electrostatic chuck may be used, which holds the mask 300 using electrostatic forces between the chuck and the backside (i.e., the conductive layer 301) of the mask 300. In other embodiments, a mechanical chuck may be used, which holds the mask 300 using mechanical forces.

FIG. 1 illustrates a schematic representation of a typical lithographic system, in accordance with an embodiment. The system 100 may be, for example, an EUV lithographic system.

As shown, the system 100 includes an energy source 104 configured to emit electromagnetic radiation. The electromagnetic radiation may comprise EUV radiation. The energy source 104 may be or may include, for example, a laser-fired plasma source, a discharge source, or an undulator or wiggler in an electron beam storage ring or synchrotron. Other energy sources are possible as well.

The system 100 further includes optics 106 for guiding the electromagnetic radiation to a mask holder 108. The optics 106 may include, for example, one or more filters, mirrors, reflecting surfaces, and/or adjusters. Other optics 106 are possible as well. The optics 106 may be arranged with the energy source 104 such that off-axis irradiation of a mask 110 is obtained. Some or all of the optics 106 may be reflective (e.g., as opposed to transmissive).

The mask holder 108 may be configured to hold the mask 110. The mask holder 108 may comprise, for example, an electrostatic chuck. The mask 110 may comprise, for example, a reticle including a pattern. The pattern may modulate the electromagnetic radiation to produce modulated electromagnetic radiation.

The system 100 further includes projection optics 112 for guiding the modulated electromagnetic radiation to a substrate holder 114 configured to hold a substrate 116 on which a resist layer 118 is formed. The modulated electromagnetic radiation may expose the resist layer 118, thereby forming a pattern on the substrate 116. The projection optics 112 may include one or more of, for example, filters, mirrors, reflecting surfaces, adjusters, and/or, possibly, lenses. Other projection optics 112 are possible as well.

In some embodiments, the mask holder 108 may be moveable with respect to the substrate stage 114. In some embodiments, the system 100 may be a wafer stepper system or a step-and-scan system.

Figure 10:
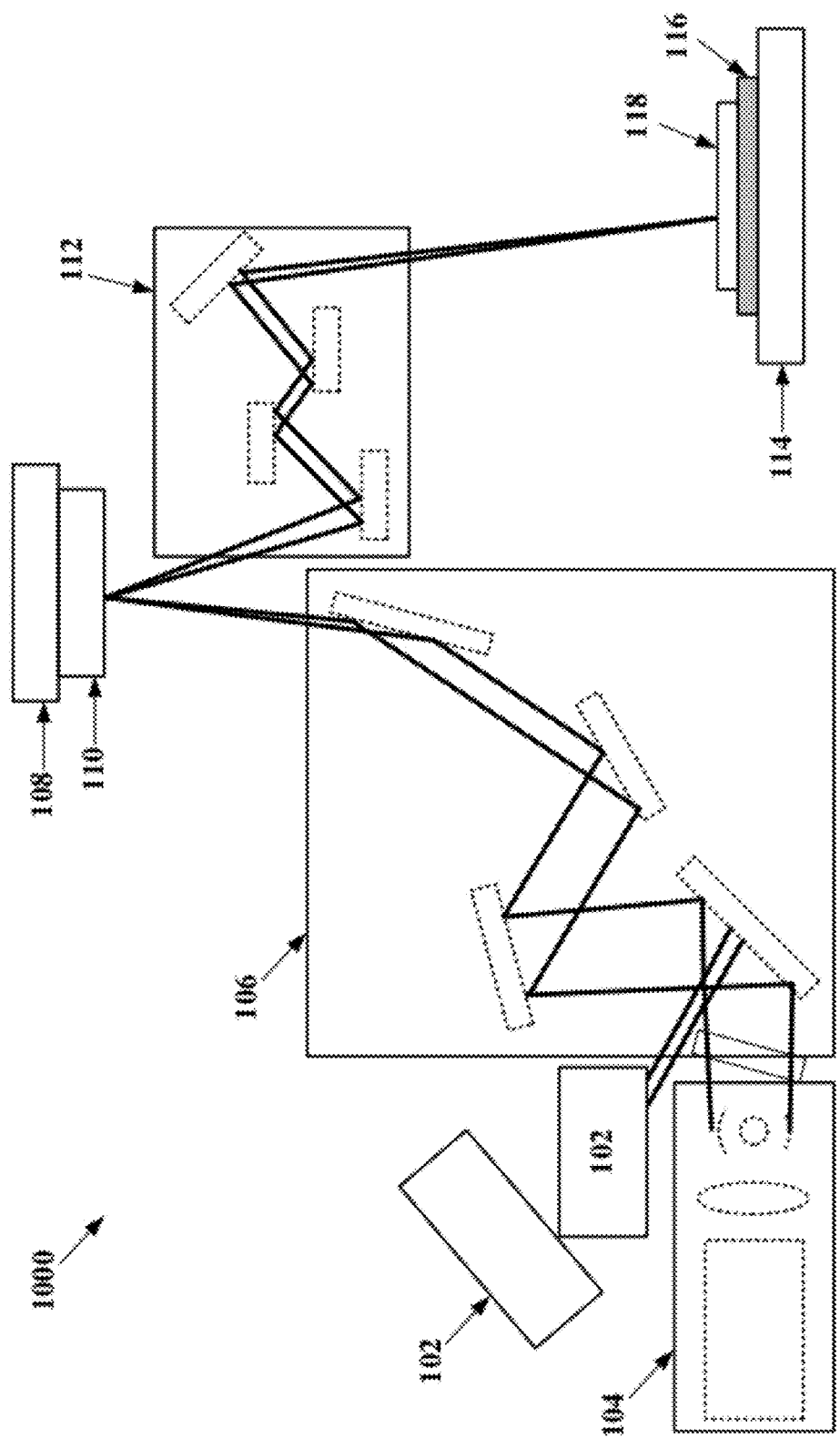
FIG. 10 illustrates a schematic representation of an example lithographic system, in accordance with an embodiment.

FIG. 10 illustrates a schematic representation of an example lithographic system, in accordance with an embodiment. As shown, the example lithographic system 1000 is similar to the lithographic system 100 described above. However, the example lithographic system 1000 further includes a second energy source 102.

The lithographic system 1000 may include a first energy source 104, a second energy source 102, a lithographic optical element 110, a holder for the lithographic optical element 108, and a substrate holder 114.

Each of the energy sources 102, 104 may be configured to emit electromagnetic radiation in a predetermined wavelength range. In some embodiments, the energy sources 102, 104 may be combined in a single energy source.

In embodiments in which a single energy source is used, the energy source may be an EUV-and-DUV energy source, and may emit electromagnetic radiation having a wavelength in the EUV and DUV ranges. In some embodiments, the range may be fairly narrow, such as, for example, about 7% of EUV and DUV light.

In embodiments where two energy sources are used, a first energy source may be a DUV energy source, and the second energy source may be an EUV source.

The first energy source may emit electromagnetic radiation having a wavelength in the DUV range. The DUV energy source may emit electromagnetic radiation in a monochromatic or quasi-monochromatic wavelength range comprising close to a single wavelength. In some embodiments, the electromagnetic radiation may have a wavelength in a range of 130 nm to 400 nm. In particular, the electromagnetic radiation may have a wavelength in a narrow wavelength range centered around a single wavelength, such as 193 nm (+/−1 nm) or 248 nm (+/−1 nm). In some embodiments, the single wavelength may be greater than two times the maximum height difference in the topography of the lithographic optical element.

The second energy source may emit electromagnetic radiation having a wavelength in the EUV range. To this end, the second energy source may be a standard EUV energy source, as used in typical lithographic processes. For example, the EUV energy source may be, for example, a laser-produced plasma (LPP) energy source, such as a Sn-based LPP energy source, which has a highly intense emission peak at 13.5 nm.

The lithographic optical element 110 may comprise a mask, such as a EUV mask. In general, the lithographic optical element 110 comprises a frontside with a topography. The topography may comprise different heights of the surface of the frontside, and may be defined by a flatness error and/or a local slope angle, as described above in connection with FIG. 4. The shape may be defined by a local slope angle. The topography may reflect the contour of the frontside surface of the lithographic optical element 110, and may be expressed as a topographic profile that displays height as a function of distance, as shown in FIG. 4. The topographic profile may be two-dimensional (e.g., height versus distance in one direction) or three-dimensional (e.g., height versus distance in two directions).

In some embodiments, the lithographic optical element 110 may be reflective to electromagnetic radiation in both the EUV and DUV wavelength ranges. In other embodiments, the lithographic optical element may be reflective to electromagnetic radiation in the DUV wavelength range, but may be non-reflective to electromagnetic radiation in the EUV wavelength range (and, in some embodiments, electromagnetic radiation of other wavelengths). To this end, the lithographic optical element 110 may comprise a mask having an absorber layer, such as, for example, the absorber stack 304 described above in connection with FIGS. 3A and 3B. The absorber layer may be configured to absorb electromagnetic radiation in the EUV wavelength range but reflect electromagnetic radiation in the DUV wavelength range.

In some embodiments, the lithographic optical element 110 may be arranged to receive the electromagnetic radiation at an angle of about 6 degrees with respect to a plane perpendicular to the surface plane of the lithographic optical element 110.

The lithographic optical element 110 may be configured to receive the electromagnetic radiation at its frontside, and to reflect at least a portion of the electromagnetic radiation from its frontside towards the substrate.

In embodiments where the lithographic optical element 110 is reflective to electromagnetic radiation in both the EUV and DUV wavelength ranges, the lithographic optical element 110 may receive electromagnetic radiation having wavelengths in both the EUV and DUV ranges (e.g., from a single EUV-and-DUV energy source, or from an EUV source and a DUV source), and may reflect at least a portion of the electromagnetic radiation in the EUV and DUV wavelength ranges.

Alternately, in embodiments where the lithographic optical element 110 is reflective to electromagnetic radiation in the DUV wavelength range, but non-reflective to electromagnetic radiation in the EUV wavelength range, the lithographic optical element may receive electromagnetic radiation having wavelengths in both the EUV and DUV ranges (e.g., from a single EUV-and-DUV energy source, or from an EUV source and a DUV source), and may reflect at least a portion of the electromagnetic radiation in the DUV wavelength range.

The substrate holder 114 may be configured to hold a substrate 116. The substrate 116 comprises a photosensitive layer 118. The substrate 116 will act as a detector for the electromagnetic radiation emitted by the energy source 102.

The substrate 116 may be an off-the-shelf substrate including the photosensitive layer, or may be an off-the-shelf substrate on which the photosensitive layer is coated. The substrate 116 may include a semiconductor layer such as, for example, a silicon, gallium arsenide (GaAs), gallium arsenide phosphide (GaAsP), indium phosphide (InP), germanium (Ge), or silicon germanium (SiGe) substrate. In some embodiments, the substrate 116 may include, for example, an insulating layer such as an $SiO_2$ or an $Si_3N_4$ layer in addition to semiconductor layer. For example, the substrate 116 may be a silicon-on-glass or silicon-on sapphire substrate. More generally, the substrate 116 may be any other base on which a layer is formed, such as a glass or metal layer. Accordingly, a substrate 116 may be a wafer, such as a blanket wafer, or may be a layer applied to another base material, such as an epitaxial layer grown onto a lower layer. The substrate 116 may be unpatterned. In some embodiments, the substrate 116 may be a bare semiconductor wafer.

The photosensitive layer 118 may comprise a photoresist (or resist), such as a positive or negative photoresist. In any case, the photosensitive layer 118 is sensitive to the electromagnetic radiation emitted by the energy source. The photosensitive layer 118 may be provided on the substrate 116 using a number of techniques, such as, for example, a spin-coating technique.

In operation, before starting a typical lithographic process for, e.g., patterning a substrate using the energy source 104, an exposure using the additional energy source 102 may be performed.

To this end, a substrate 116 comprising a resist layer 118 may be placed in the substrate holder 114. Further, a mask 110 may be placed in the mask holder 108. Then, the substrate 116 may be exposed via the mask 110 with electromagnetic radiation from the additional energy source 102. The exposed substrate 116 may then be evaluated to determine topography (e.g., the flatness) of the mask 110 and/or the mask holder 108, and corrections may be made to the mask 110 and/or the mask holder 108 based on the topography.

Following the evaluation and, optionally, the correction, the substrate 116 may be exposed via the mask 110 with electromagnetic radiation from the energy source 104, thereby patterning the substrate 116.

Figure 2A:
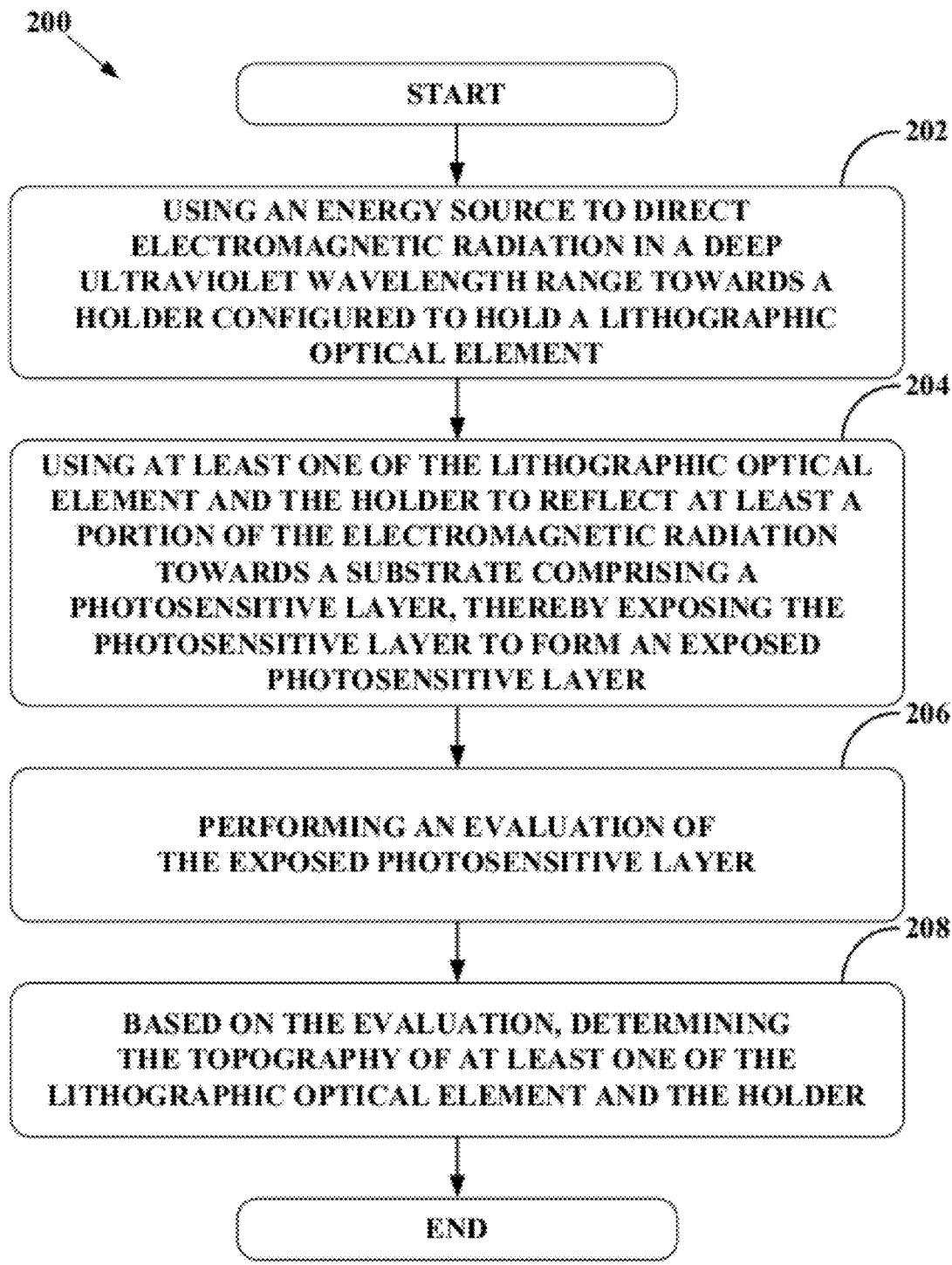
FIG. 2A shows a schematic flow diagram illustrating an example method, in accordance with an embodiment.

FIG. 2A shows a schematic flow diagram illustrating an example method, in accordance with an embodiment. The method 200 may be carried out in a lithographic system, such as the EUV lithographic system described above.

As shown, the method 200 begins at block 202 where an energy source is used to direct electromagnetic radiation in a deep ultraviolet wavelength range towards a holder configured to hold a lithographic optical element.

The method 200 continues at block 204 where at least one of the lithographic optical element and the holder is used to reflect at least a portion of the electromagnetic radiation towards a substrate comprising a photosensitive layer, thereby exposing the photosensitive layer to form an exposed photosensitive layer. The exposure may be done in focus. In some embodiments, however, an unfocused exposure may provide additional topographical information.

The method 200 continues at block 206 where an evaluation of the exposed photosensitive layer is performed. The evaluation may involve an optical evaluation, using a microscope, such as, for example, an atomic force microscope (AFM), an optical microscope, an electron microscopy (for example SEM or TEM), and/or an interferometer. Further, the evaluation may be performed in situ, such as in the lithographic system. In some embodiments, the optical evaluation may allow for detection of at least one of height differences and fringes in the exposed photosensitive layer. The evaluation may be performed in two dimensions, or in three dimensions.

The method 200 continues at block 208, where, based on the evaluation, a topography of at least one of the lithographic optical element and the holder is determined. In some embodiments, the determined topography may be used to correct at least one of the lithographic optical element and the holder. The topography may indicate one or more topographical parameters, such as, for example, a flatness error value, a maximum height difference value, a curvature value, an rms-value, or another value. Correcting the lithographic optical element may be done when one or more topographical parameters are larger than a predetermined value.

In some embodiments, the method 200 may be repeated using an additional lithographic system including an additional energy source similar to the energy source, an additional holder similar to the holder, and an additional lithographic optical element similar to the lithographic optical element. By using at least one of the additional lithographic optical element to reflect electromagnetic radiation in the deep ultraviolet wavelength range towards an additional substrate comprising an additional photosensitive layer, the additional photosensitive layer may be exposed to form an exposed additional photosensitive layer. An evaluation of the exposed additional photosensitive layer may be performed. Based on the evaluation, an additional topography of at least one of the lithographic optical element and the holder may be determined. The topography may then be compared with the additional topography, to compare the lithographic system and the additional lithographic system.

Before or after the method 200, the substrate may be lithographically patterned using, for example, electromagnetic radiation having wavelengths in the EUV range.

Figure 2B:
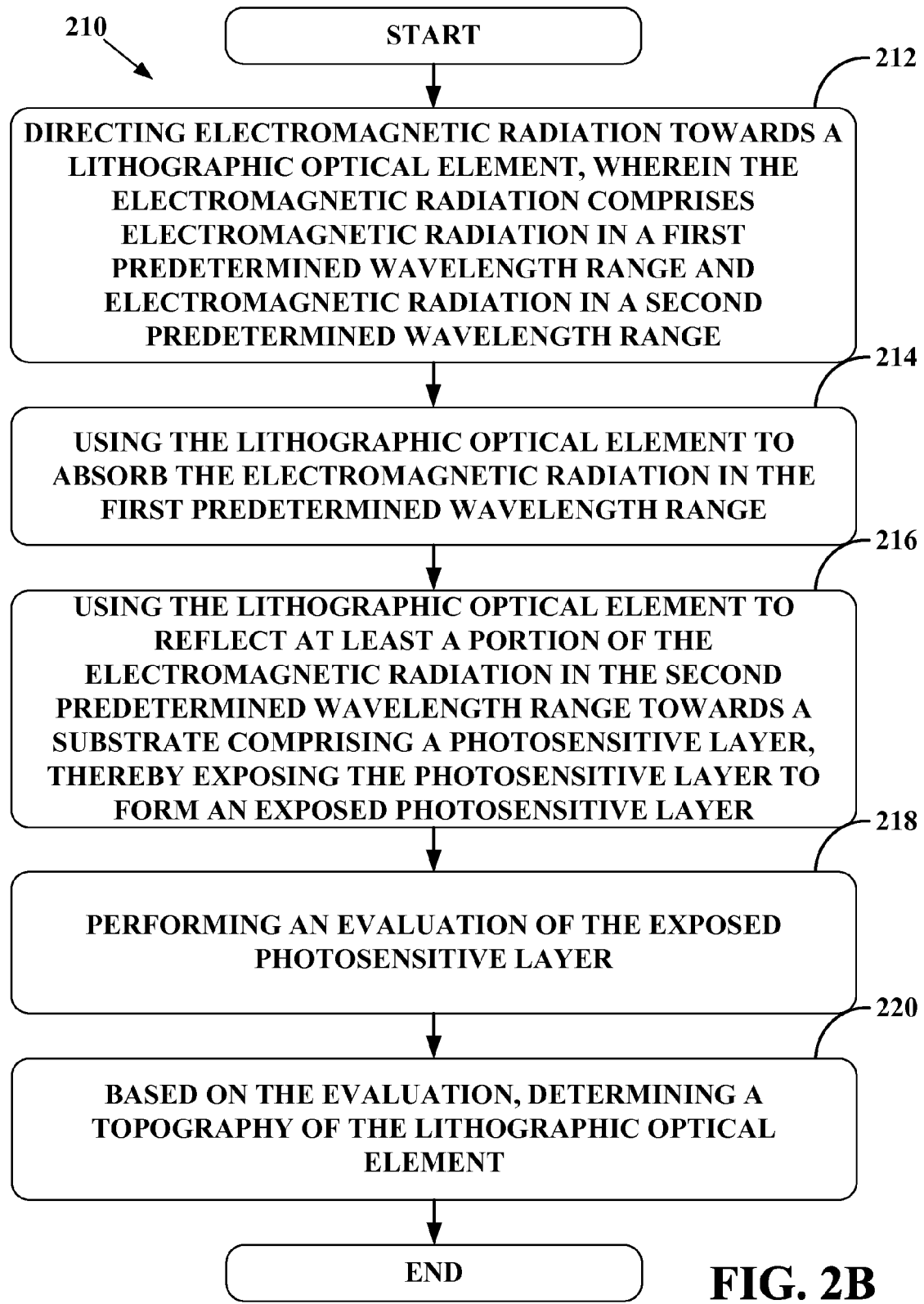
FIG. 2B shows a schematic flow diagram illustrating another example method, in accordance with an embodiment.

FIG. 2B shows a schematic flow diagram illustrating another example method, in accordance with an embodiment. The method 210 may similarly be carried out in a lithographic system, such as the EUV lithographic system described above.

As shown, the method 210 begins at block 212 where electromagnetic radiation is directed towards a lithographic optical element. The electromagnetic radiation comprises electromagnetic radiation in a first predetermined wavelength range and electromagnetic radiation in a second predetermined wavelength range. In some embodiments, wavelengths in the second predetermined wavelength range may be longer than wavelengths in the first predetermined wavelength range. For example, the first predetermined wavelength range may comprise an EUV wavelength range, and the second predetermined wavelength range may comprise a DUV wavelength range.

The method 210 continues at block 214 where the lithographic optical element is used to absorb the electromagnetic radiation in the first predetermined wavelength range. This may be achieved with a filter on the lithographic optical element.

The method 210 continues at block 216 where the lithographic optical element is used to reflect at least a portion of the electromagnetic radiation in the second predetermined wavelength range towards a substrate comprising a photosensitive layer, thereby exposing the photosensitive layer to form an exposed photosensitive layer.

By using a multilayer film on the lithographic optical element, such as, for example a Molybdenum/Silicon (Mo/Si) multilayer, a high reflectivity of about 70% may be achieved at a wavelength of 13.5 nm with a 2% bandwidth. Light within 1% bandwidth is called 'in-band' radiation. However the lithographic optical element may also reflect other wavelengths which are known as 'out-of-band' radiation. Out-of-band radiation is generally classified into two bands, a first band from 130 to 400 nm and a second band from 400 nm to infrared and visible radiation. For determining the topography of lithographic optical element, the so called out-of-band radiation of the EUV source, i.e., the DUV wavelength part of the EUV source, is of importance.

At block 218, an evaluation of the exposed photosensitive layer is performed. The evaluation may take any of the forms described above.

At block 220, based on the evaluation, a topography of the lithographic optical element is determined.

Figure 6A:
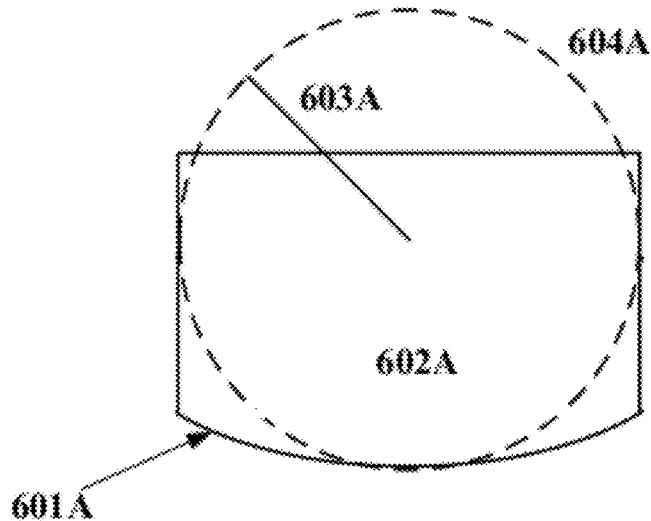
FIGS. 6A and 6B each illustrate an example curvature, in accordance with an embodiment.
Figure 6B:
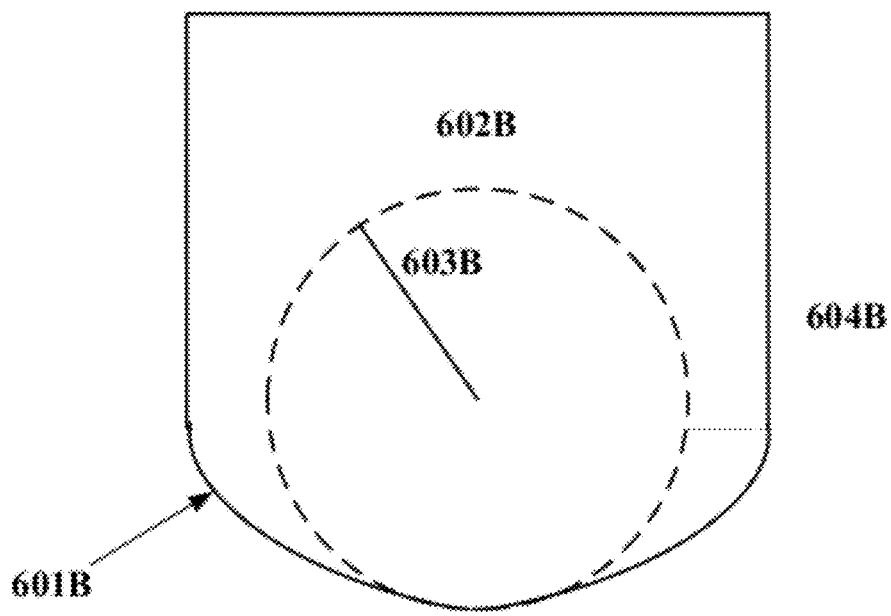

FIGS. 6A and 6B each illustrate an example topography of a lithographic optical element, in accordance with an embodiment. The topography may be, for example, a curvature of a frontside of the lithographic element. The curvature may be convex or concave, though for EUV masks the curvature is most often convex.

The curvature of the lithographic optical element may be characterized by the radius of curvature. A smaller radius of curvature indicates a larger curvature, while a larger radius of curvature indicates a smaller curvature.

As shown in FIG. 6A, a lithographic optical element 602A has a convex curvature 601A. Similarly, as shown in FIG. 6B, a lithographic optical element 602B has a convex curvature 601B. The curvature 601A of the lithographic optical element 602A is less than the curvature 601B of the lithographic optical element 602B. That is, the surface of the lithographic optical element 602A is flatter than the surface of the lithographic optical element 602B. Consequently, a radius of curvature 603A for the lithographic optical element 602A is larger than a radius of curvature 603B for the lithographic optical element 602B. The radii of curvature 603A, 603B are each defined by the radius a circle 604A or 604B, respectively, which fits in the curvature 601A or 601B, respectively.

Figure 5:
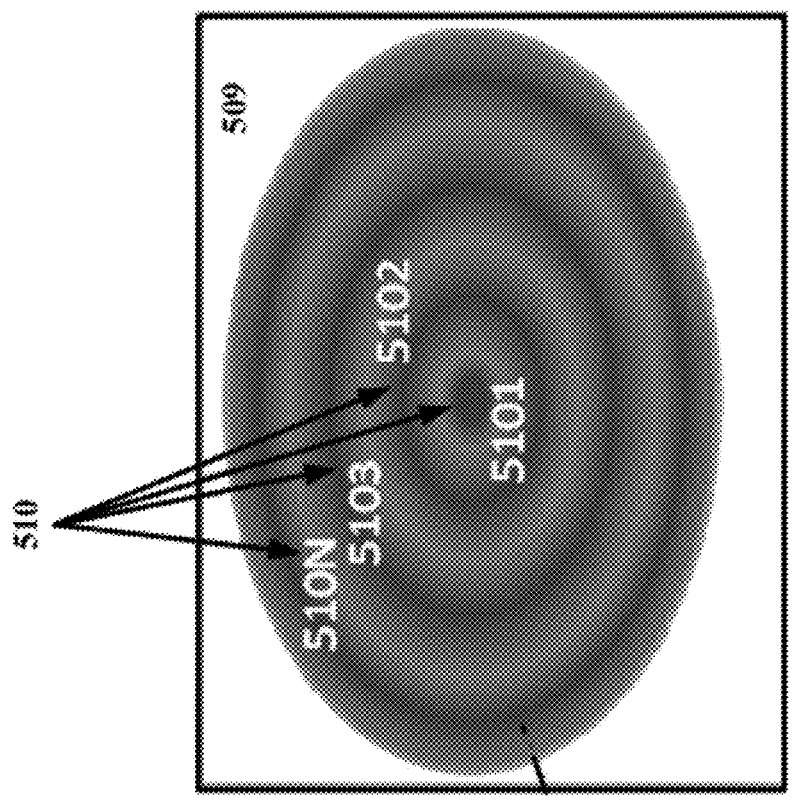
FIG. 5 illustrates a schematic representation of determining topography of a lithographic optical element, in accordance with an embodiment.
Figure 5:
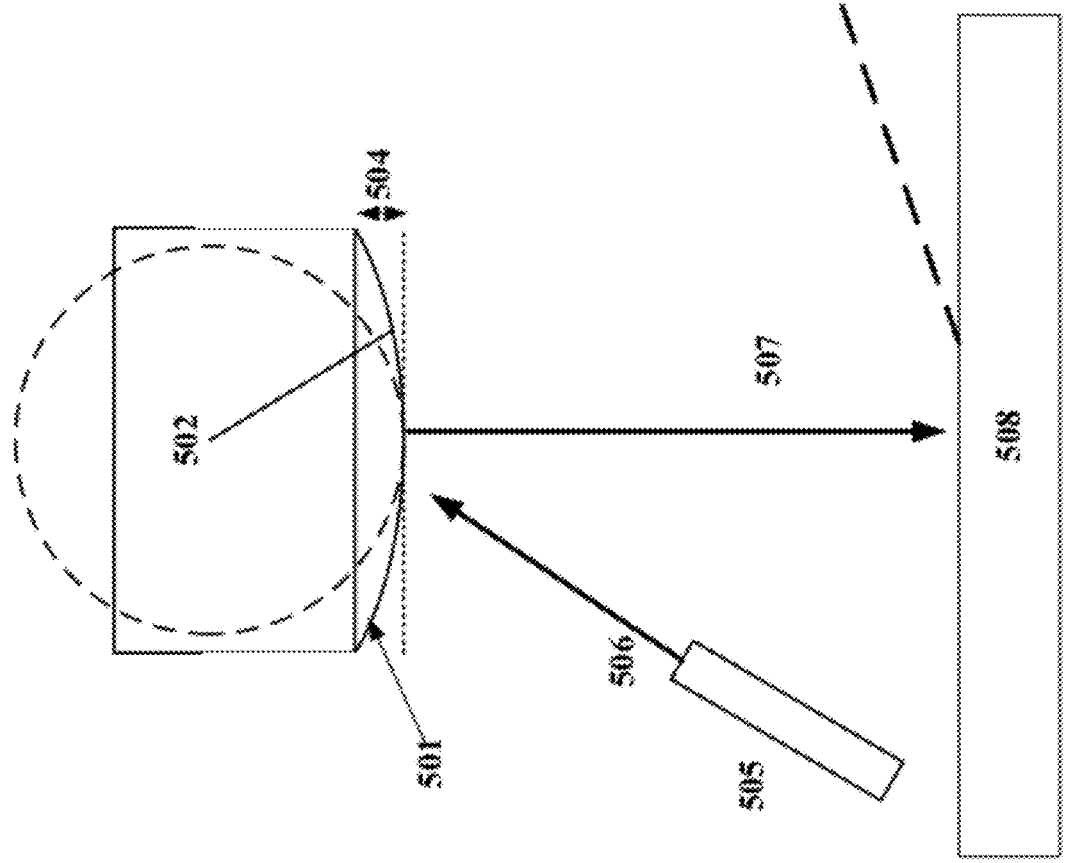

FIG. 5 illustrates a schematic representation of determining topography of a lithographic optical element, in accordance with an embodiment. As shown, electromagnetic radiation 506 from an energy source 505 is directed towards a lithographic optical element 502. At least a portion of the electromagnetic radiation 506 has wavelengths in the DUV wavelength range.

At least a portion 507 of the electromagnetic radiation 506 is reflected off a frontside 501 of the lithographic optical element 502 towards a substrate 508 including a photosensitive layer. As a result of being illuminated by the portion 507 of the electromagnetic radiation 506, the substrate 508 is patterned to include a series of fringes 510 ($510_1$, $510_2$, $510_3$, ... $510_N$). The fringes 510 define the topography of the lithographic optical element 502.

In this system, the energy source 505 acts as a source of the electromagnetic radiation 506, the frontside 501 of the lithographic optical element 502 acts as an interference with which the electromagnetic radiation 506 interferes, such that only the portion 507 is reflected, and the substrate 508 acts as a detector for detecting the topography of the lithographic optical element 502.

Due to the interference of the frontside 501 of the lithographic optical element 502, the portion 507 of the electromagnetic radiation 506 will be reflected in or out of phase, depending on the path difference of the electromagnetic radiation 506. In particular, in-phase reflections will occur when the path difference for the reflected electromagnetic radiation 507 is an integral number n of the wavelength $\lambda$ of the electromagnetic radiation 506, and out-of-phase reflections will occur when the path difference for the reflected electromagnetic radiation 507 is not an integral number n of the wavelength $\lambda$ of the electromagnetic radiation 506.

The path difference may be defined as $2d \sin(\alpha)$, wherein d is the distance between the planes (i.e., the height difference between the planes on which the electromagnetic radiation is impinging). Thus, in-phase reflections will occur for $2d \sin(\alpha)=n\lambda$, when n is an integral number, and out-of-phase reflections will occur for $2d \sin(\alpha) \neq n\lambda$, when n is an integral number.

For in-phase reflections, constructive interference will occur, resulting in a bright fringe 510 in the exposed substrate 508. For out-of-phase reflections, destructive interference will occur, resulting in a dark fringe 510 in the exposed substrate 508. Thus, the bright and dark fringes 510 depend on the wavelength of the electromagnetic radiation 506.

In order to be sensitive to a maximum height difference, the path difference d should be smaller than $\lambda/2$. For example, as SEMI standards require a flatness error smaller than 35 nm, the wavelength used should be larger than 70 nm.

In general, the fringes will be more visible for longer wavelengths of electromagnetic radiation. In typical EUV lithographic processes, the wavelength of the electromagnetic radiation (about 13.9 nm) is much to short for the fringes to be visible. However, by applying the electromagnetic radiation with a longer wavelength, such as the electromagnetic having wavelength in the DUV range, the fringes become visible.

Figure 8:
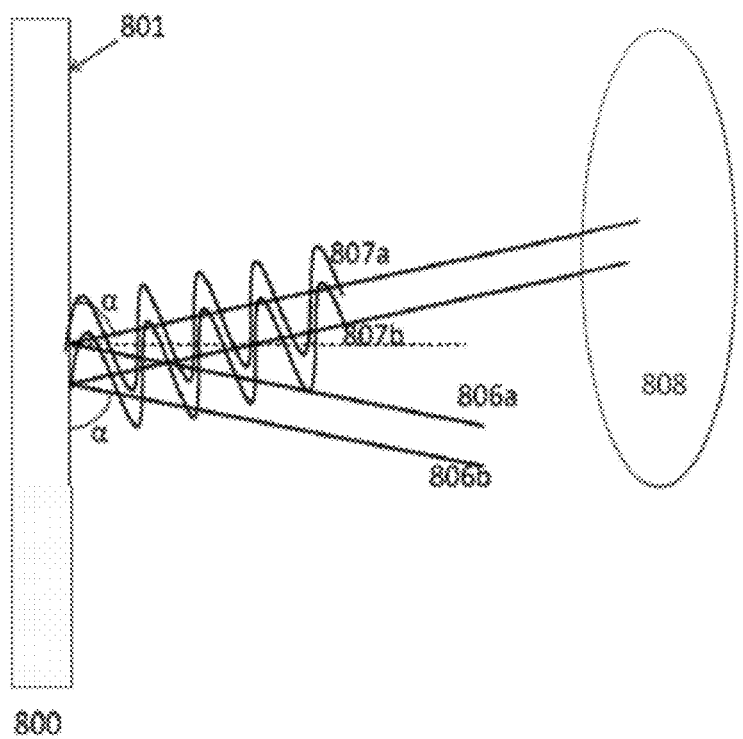
FIG. 8 illustrates a schematic representation of determining the topography of a flat lithographic optical element, in accordance with an embodiment.
Figure 9:
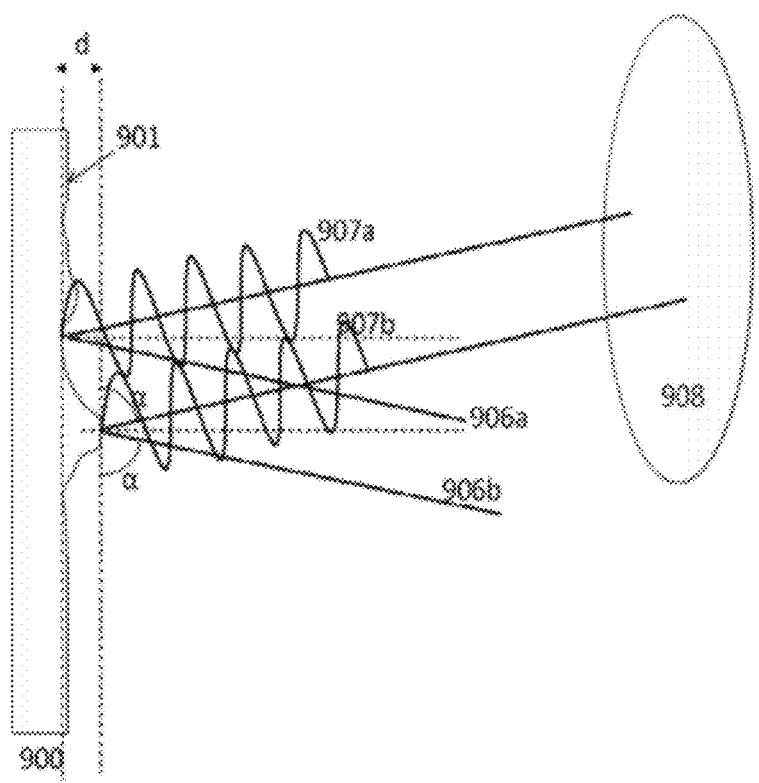
FIG. 9 illustrates a schematic representation of determining the topography of a curved lithographic optical element, in accordance with an embodiment.

Interference between the electromagnetic radiation, the lithographic optical element, and the substrate are illustrated in FIGS. 8 and 9.

FIG. 8 illustrates a schematic representation of determining the topography of a flat lithographic optical element, in accordance with an embodiment. A lithographic optical element 800 with frontside 801 having a substantially flat topography is shown. Electromagnetic radiation (including electromagnetic waves 806A and 806B) is directed towards the frontside 801. The electromagnetic waves 806A and 806B are reflected off of the frontside 801 from the same plane, since the frontside 801 is substantially flat. Then, the electromagnetic waves 806A and 806B and are directed towards a substrate 808. Because the electromagnetic waves 806A and 806B are reflected from the same plane, the reflected electromagnetic waves 807A and 807B are in phase, such that constructive interference will occur. As shown, the path difference d between the reflected electromagnetic waves 807A and 807B is substantially 0.

FIG. 9 illustrates a schematic representation of determining the topography of a curved lithographic optical element, in accordance with an embodiment. A lithographic optical element 900 with a frontside 901 having a non-flat topography is shown. Electromagnetic radiation (including electromagnetic waves 906A and 906B) is directed towards the frontside 901. The electromagnetic waves 906A and 906B are reflected off of the frontside 901 from different planes, since the front side 901 is non-flat. Then, the electromagnetic waves 906A and 906B and are directed towards a substrate 908. Because the electromagnetic waves 906A and 906B are reflected from different planes, the reflected electromagnetic waves 907A and 907B are out of phase, and it is likely that destructive interference will occur. As shown, the path difference d between the reflected electromagnetic waves 907A and 907B is not equal to 0. It is possible, if the path difference d is an integral number of the wavelength of the electromagnetic radiation, constructive interference will occur.

Figure 7:
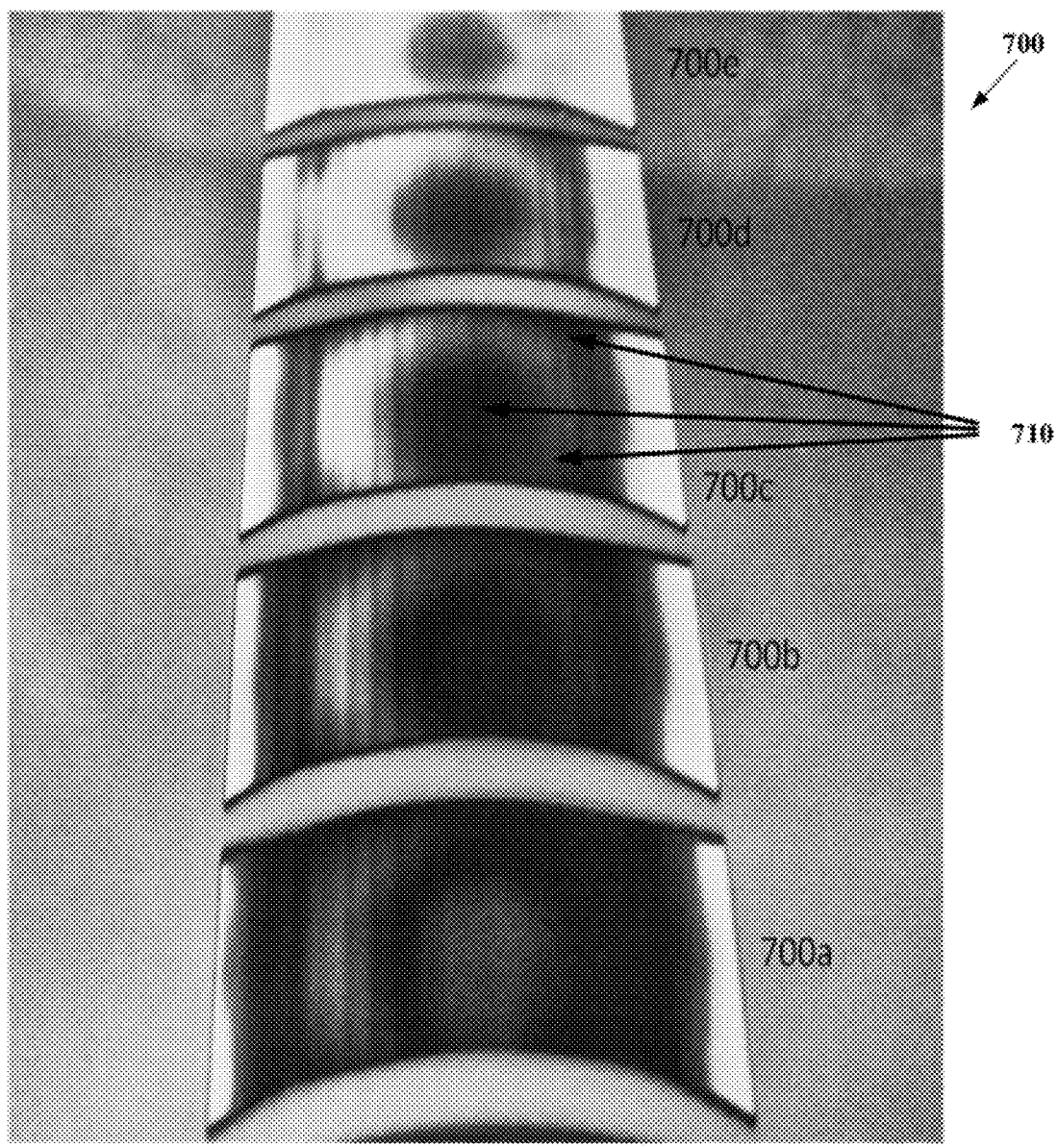
FIG. 7 shows experimental microscopy images of substrates exposed using an example method, in accordance with an embodiment.

FIG. 7 shows experimental microscopy images of substrates exposed using an example method, in accordance with an embodiment. In particular, five sub-images (700A-E) are visible for the same substrate but exposed with an increasing dose going from the bottom sub-image 700a up to the top sub-image 700e. From these experimental measurements, it becomes clear one should balance the exposure dose in order to transfer the topography of the lithographic optical element to the substrate (with photosensitive layer). For the images shown, the exposure was performed by using the DUV wavelength part from an EUV source. For this example a plasma produced EUV source is used. The lithographic optical element is a MoSi multilayer reticle with a Ru top surface. In this case, the spectral characteristics are exactly known. Circular fringes become visible on the exposed semiconductor substrate after exposure with electromagnetic radiation via a EUV reticle. The scale of the observed fringes is in the range of millimeters.

The amount of fringes and the distance between the subsequent fringes may determine in more detail the curvature or topography of the lithographic optical element. The determination is based on interference of light physics, as will be understood by a person of ordinary skill in the art. This phenomenon describes the occurrence of an interference pattern caused by the reflection of light between two surfaces. When monochromatic light is used, a series of concentric, alternating light and black rings (fringes) may become visible. The light rings are caused by constructive interference between the light rays reflected from both surfaces/planes, whereas the dark rings are caused by destructive interference. Also, the outer rings are spaced more closely than the inner ones.

As indicated above, in some embodiments, the electromagnetic radiation source generating electromagnetic radiation for evaluating a topography of the lithographic element or its holder may be a separate source, different from the irradiation source provided for lithographic processing, whereas in other embodiments, the electromagnetic radiation source generating electromagnetic radiation for evaluating a topography also generates the electromagnetic radiation for lithographic processing.

Figure 11A:
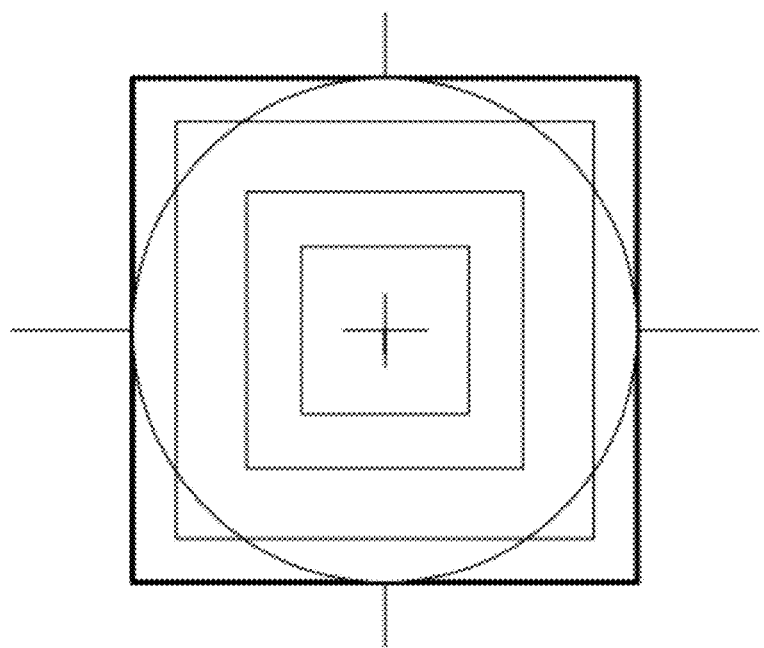
FIGS. 11A and 11B each show simulation results of an exposed substrate, in accordance with an embodiment.
Figure 11B:
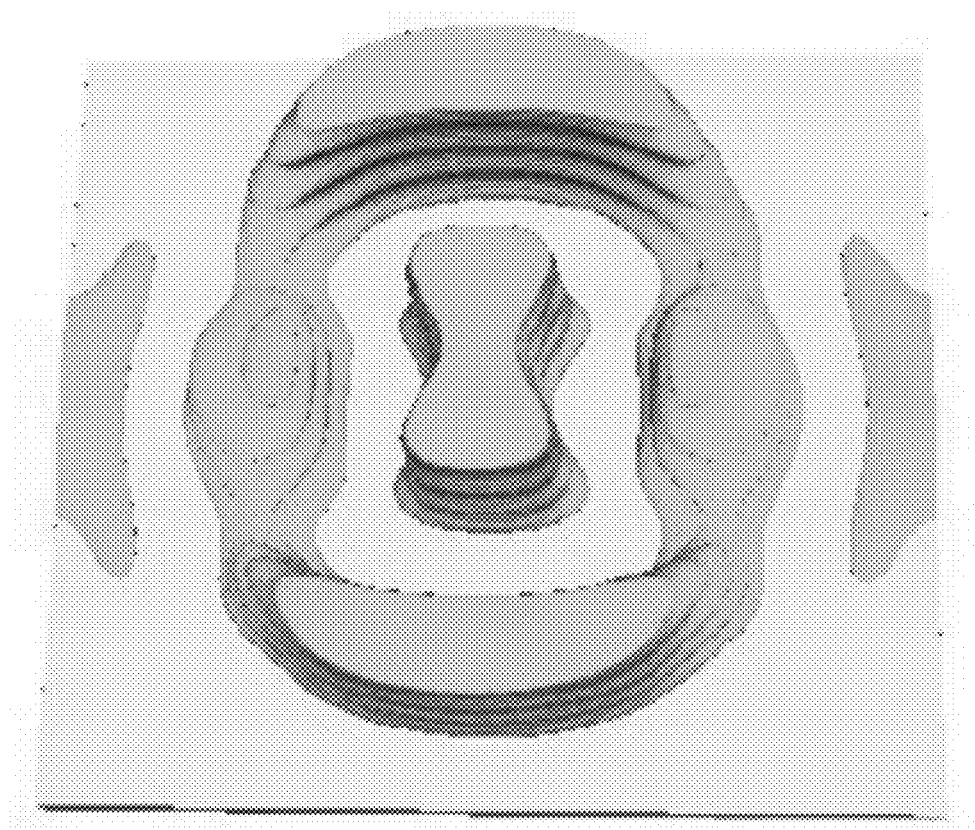

FIGS. 11A and 11B each show simulation results of an exposed substrate, in accordance with an embodiment. In particular, FIG. 11B shows simulated results of a series of concentric, alternating light and black rings (fringes) for a wavelength of 250 nm for the electromagnetic radiation. FIG. 11A shows the simulated scheme for the lithographic optical element. The Figures simulate a height difference caused by a bow or curvature of about 250 nm, with the height difference increasing from inner to outer rectangle. FIG. 11B shows the exposure simulation on the substrate for an exposure with a wavelength of 248 nm. From this simulation one can nicely recognize the different fringes, dark and bright, due to the destructive and constructive interference which occurs at the simulated lithographic optical element of FIG. 11A. When fitting this data to the experimental results of FIG. 7, one can see a very good qualitative agreement. From calculations and comparison with other reticle flatness metrology tools, a curvature of about 250 nm is retrieved for the lithographic optical element. Thus, by using the disclosed methods and systems, one may see the topography signature of the chucked lithographic optical element (reticle) on the exposed substrate using an irradiation source emitting electromagnetic radiation in the DUV wavelength range.

The present invention also relates to a computer program product for performing, when executed on a processing means, a method for determining topography as described above. The present invention furthermore relates to a machine readable data storage device storing such a computer program product or the transmission thereof over a local or wide area telecommunications network.

The above described method embodiments for evaluating a lithographic system may be at least partly implemented in a processing system. Also the systems as described above may be implemented as a processing system, may be part thereof, or may comprise such a processing system. In one configuration of the processing system, at least one programmable processor coupled to a memory subsystem is present that includes at least one form of memory, e.g., RAM, ROM, and so forth. It is to be noted that the processor or processors may be a general purpose, or a special purpose processor, and may be for inclusion in a device, e.g., a chip that has other components that perform other functions. Processing may be performed in a distributed processing manner or may be performed at a single processor. Thus, one or more aspects of the present invention can be implemented in digital electronic circuitry, or in computer hardware, firmware, software, or in combinations of them. The different steps may be computer-implemented steps. The processing system may include a storage subsystem that has at least one disk drive and/or CD-ROM drive and/or DVD drive. In some implementations, a display system, a keyboard, and a pointing device may be included as part of a user interface subsystem to provide for a user to manually input information. Ports for inputting and outputting data also may be included. More elements such as network connections, interfaces to various devices, and so forth, may be included. The memory of the memory subsystem may at some time hold part or all of a set of instructions that when executed on the processing system implement the steps of the method embodiments described herein. A bus may be provided for connecting the components. Thus, a system is described that includes the instructions to implement aspects of the methods for evaluating the lithographic tool or lithographic optical element.

The present invention also includes a computer program product which provides the functionality of any of the methods according to the present invention when executed on a computing device. Such computer program product can be tangibly embodied in a carrier medium carrying machine-readable code for execution by a programmable processor. The present invention thus relates to a carrier medium carrying a computer program product that, when executed on computing means, provides instructions for executing any of the methods as described above. The term "carrier medium" refers to any medium that participates in providing instructions to a processor for execution. Such a medium may take many forms, including but not limited to, non-volatile media, and transmission media. Non-volatile media includes, for example, optical or magnetic disks, such as a storage device which is part of mass storage. Common forms of computer readable media include, a CD-ROM, a DVD, a flexible disk or floppy disk, a tape, a memory chip or cartridge or any other medium from which a computer can read. Various forms of computer readable media may be involved in carrying one or more sequences of one or more instructions to a processor for execution. The computer program product can also be transmitted via a carrier wave in a network, such as a LAN, a WAN or the Internet. Transmission media can take the form of acoustic or light waves, such as those generated during radio wave and infrared data communications. Transmission media include coaxial cables, copper wire and fibre optics, including the wires that comprise a bus within a computer.

It is to be understood that although preferred embodiments, specific constructions and configurations, as well as materials, have been discussed herein for devices according to the present invention, various changes or modifications in form and detail may be made without departing from the scope and spirit of this invention. Functionality may be added or deleted from the block diagrams and operations may be interchanged among functional blocks. Steps may be added or deleted to methods described within the scope of the present invention.

The invention claimed is:

1. A method comprising:
using an energy source to direct electromagnetic radiation in a deep ultraviolet wavelength range towards a holder configured to hold a lithographic optical element;
using at least one of the lithographic optical element and the holder to reflect at least a portion of the electromagnetic radiation towards a substrate comprising a photosensitive layer, thereby exposing the photosensitive layer to form an exposed photosensitive layer;
performing an evaluation of the exposed photosensitive layer; and
based on the evaluation, determining a topography of at least one of the lithographic optical element and the holder.

2. The method of claim 1, wherein performing the evaluation comprises performing an optical evaluation.

3. The method of claim 2, wherein performing the evaluation comprises performing the optical evaluation in situ.

4. The method of claim 1, wherein performing the evaluation comprises detecting at least one of height differences and fringes in the exposed photosensitive layer.

5. The method of claim 1, further comprising:
using the topography to correct at least one of the lithographic optical element and the holder.

6. The method of claim 1, further comprising:
using an additional energy source to direct electromagnetic radiation in a deep ultraviolet wavelength range towards an additional holder configured to hold an additional lithographic optical element;
using at least one of the additional lithographic optical element and the additional holder to reflect at least a portion of the electromagnetic radiation towards an additional substrate comprising an additional photosensitive layer, thereby exposing the additional photosensitive layer to form an exposed additional photosensitive layer;
performing an evaluation of the exposed additional photosensitive layer;
based on the evaluation, determining an additional topography of at least one of the lithographic optical element and the holder; and
comparing the topography with the additional topography.

7. The method of claim 1, further comprising:
using an additional energy source to direct electromagnetic radiation in an extreme ultraviolet wavelength range towards the holder;
using at least one of the lithographic optical element and the holder to reflect at least a portion of the electromagnetic radiation in the extreme ultraviolet wavelength range towards the exposed photosensitive layer, thereby patterning the exposed photosensitive layer.

8. A method comprising:
- directing electromagnetic radiation towards a lithographic optical element, wherein the electromagnetic radiation comprises electromagnetic radiation in a first predetermined wavelength range and electromagnetic radiation in a second predetermined wavelength range;
- using the lithographic optical element to absorb the electromagnetic radiation in the first predetermined wavelength range;
- using the lithographic optical element to reflect at least a portion of the electromagnetic radiation in the second predetermined wavelength range towards a substrate comprising a photosensitive layer, thereby exposing the photosensitive layer to form an exposed photosensitive layer;
- performing an evaluation of the exposed photosensitive layer; and
- based on the evaluation, determining a topography of the lithographic optical element.

9. The method of claim 8, wherein wavelengths in the second predetermined wavelength range are longer than wavelengths in the first predetermined wavelength range.

10. The method of claim 8, wherein:
- the first predetermined wavelength range comprises an extreme ultraviolet wavelength range; and
- the second predetermined wavelength range comprises a deep ultraviolet wavelength range.

11. A system comprising:
- a first energy source configured to emit electromagnetic radiation comprising electromagnetic radiation in a first predetermined wavelength range;
- a second energy source configured to emit electromagnetic radiation comprising electromagnetic radiation in a second predetermined wavelength range, wherein the first energy source is different from the second energy source;
- a lithographic optical element configured to reflect at least a portion of the electromagnetic radiation in the first predetermined wavelength range and to absorb at least a portion of the electromagnetic radiation in the second predetermined wavelength range; and
- a substrate holder configured to hold a substrate comprising a photosensitive layer, wherein the lithographic optical element and the substrate are arranged such that the reflected electromagnetic radiation exposes the photosensitive layer to produce an exposed photosensitive layer.

12. The system of claim 11, wherein the first predetermined wavelength range comprises a deep ultraviolet wavelength range.

13. The system of claim 11, wherein the lithographic optical element being configured to absorb at least a portion of the electromagnetic radiation in the second predetermined wavelength range comprises the lithographic optical element including a filter configured to selectively absorb the electromagnetic radiation in the second predetermined wavelength range.

14. The system of claim 11, wherein the second predetermined wavelength range comprises an extreme ultraviolet wavelength range.

15. The system of claim 11, wherein wavelengths in the first predetermined wavelength range are longer than wavelengths in the second predetermined wavelength range.

16. The system of claim 11, further comprising optics configured to direct the electromagnetic radiation from the first energy source and the second energy source towards the lithographic optical element.

17. The system of claim 11, further comprising:
- at least one processor; and
- data instructions executable by the at least one processor to:
- perform an evaluation of the exposed photosensitive layer; and
- based on the evaluation, determine a topography of the lithographic optical element.

18. The system of claim 11, further comprising:
- a holder configured to hold the lithographic optical element and reflect at least an additional portion of the electromagnetic radiation in the first predetermined wavelength range, wherein the holder and the substrate are arranged such that the additional reflected electromagnetic radiation exposes the photosensitive layer to produce an additional exposed photosensitive layer.

19. The system of claim 18, further comprising:
- at least one processor; and
- data instructions executable by the at least one processor to:
- perform an evaluation of the additional exposed photosensitive layer; and
- based on the evaluation, determine a topography of the holder.

* * * * *